(12) United States Patent
Waayers et al.

(10) Patent No.: US 10,571,518 B1
(45) Date of Patent: Feb. 25, 2020

(54) LIMITED PIN TEST INTERFACE WITH ANALOG TEST BUS

(71) Applicant: NXP B.V., Eindhoven (NL)

(72) Inventors: Tom Waayers, Sint Michielsgestel (NL); Mahmoud Abdalwahab, Veldhoven (NL); Willem Franciscus Slendebroek, Lent (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/142,237

(22) Filed: Sep. 26, 2018

(51) Int. Cl.
| | | |
|---|---|---|
| *G01R 31/28* | (2006.01) | |
| *G01R 31/317* | (2006.01) | |
| *G01R 31/3177* | (2006.01) | |
| *G01R 31/3185* | (2006.01) | |

(52) U.S. Cl.
CPC ... *G01R 31/31713* (2013.01); *G01R 31/2815* (2013.01); *G01R 31/3177* (2013.01); *G01R 31/31727* (2013.01); *G01R 31/318558* (2013.01)

(58) Field of Classification Search
CPC .......... G01R 31/31713; G01R 31/2815; G01R 31/31727; G01R 31/3177; G01R 31/318558
See application file for complete search history.

(56) References Cited

U.S. PATENT DOCUMENTS

| | | | | |
|---|---|---|---|---|
| 5,771,240 | A * | 6/1998 | Tobin | G01R 31/31705 714/30 |
| 6,934,898 | B1 | 8/2005 | Goff | |
| 2006/0015785 | A1* | 1/2006 | Chun | G01R 31/3167 714/724 |
| 2015/0293174 | A1* | 10/2015 | Ge | G01R 31/31907 714/726 |
| 2017/0192058 | A1 | 7/2017 | Whetsel | |

OTHER PUBLICATIONS

L. Whetsel, "A High Speed Reduced Pin County JTAG Interface," IEEE ITC 2006.
IEEE 1149.7-2009—IEEE Standard for Recuced-Pin and Enhanced Functionality Test Access Port.

* cited by examiner

*Primary Examiner* — Christine T. Tu
(74) *Attorney, Agent, or Firm* — Rajeev Madnawat

(57) ABSTRACT

Certain aspects of the disclosure are directed toward test control and test access configuration via two pins on an integrated circuit (IC). According to a specific example, an IC chip-based apparatus is used in connection with a controller for testing a target IC. The IC chip-based apparatus includes an event (capture) circuit configured and arranged to control logic states through which a static test configuration is selected for a given event detected in response to a clock signal and to a data signal respectively derived from the controller. A test-operation control circuit may be configured and arranged to test the target IC by selectively configuring each of the clock pin and the I/O pin of the controller for use as an analog test bus, data input to the controller or data output from the controller, and carrying out dynamic operations by communicating test signals via pins of the target IC.

19 Claims, 12 Drawing Sheets

LIMITED PIN TEST INTERFACE WITH ANALOG TEST BUS

OVERVIEW

Aspects of various embodiments are directed to test control and test access configuration via two pins on an integrated circuit (IC).

The number of silicon dies that are tested in parallel on a single tester system continues to grow. However, devices providing digital content as well as analogue content have limited pins available for testing. Such devices may for instance be found in In Vehicle Networks, hearing devices, sensors, Near Field Communication (NFC) devices, and interface products, among others. To limit the cost of testing these silicon dies, a small number of pins can be contacted per die during testing. In some application domains (e.g. NFC, sensors), dies and/or even packages may have only a few pins for electrical access. These pins may be reused for production test access and/or in-system debug access.

While some solutions to access on-chip features for production testing or system debugging via a limited number of pins exist, these solutions may be limited to a specific type of test (e.g. scan test only), and may use technology specific on-chip (analog) features to translate voltage and/or current and/or frequencies into tester stimulus and/or response values. In these solutions, the specific access protocol may use specific (non-standard) features from the tester system. As a result, it may not be possible to run tests natively on different tester systems and such solutions often provide limited test speed, which results in increased cost to test silicon dies.

These and other matters have presented challenges to efficiencies of test control and test access on ICs, for a variety of applications.

SUMMARY

Various example embodiments are directed to issues such as those addressed above and/or others which may become apparent from the following disclosure concerning test control and test access on ICs. In certain example embodiments, aspects of the present disclosure involve use of one of the two pins on an integrated circuit (IC) as digital input/output and as an access to an analog test bus. Aspects of the present disclosure enable switching between different test configurations fully under the control of the tester system.

In a more specific example embodiment, an IC based apparatus may be used in connection with a controller in testing a target IC. In such embodiments, the IC-based apparatus includes an event (or event-capture) circuit configured and arranged to control logic states through which a static test configuration is selected for a given event detected in response to a clock signal and to a data signal respectively derived from the controller. The IC-based apparatus may further include a test-operation control circuit configured and arranged to test the target IC. The test-operation control circuit selectively configures a clock pin and an I/O pin of the controller for use as an analog test bus, data input to the controller or data output from the controller, and carries out dynamic operations by communicating test signals via pins of the target IC. Consistent with such example embodiments, the test signals are compliant with the selected test configuration, are in synchronism with the clock signal of the controller, and are in accordance with a test protocol as selected in response to the selected test configuration.

In another specific example embodiment, a target IC may be tested via a plurality of methods. In one such method, logic states may be controlled in an event circuit by setting and enabling a static test configuration for a given event detected in response to a clock signal and to a data signal respectively derived from a clock pin and an I/O pin of a controller. A test-operation control circuit may be used in response to the event circuit, for testing the target IC. The test-operation control circuit may selectively configure the clock pin and the I/O pin of the controller for use as an analog test bus, data input to the controller or data output from the controller. The test-operation control circuit may then carry out dynamic operations by communicating test signals via pins of the target IC.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
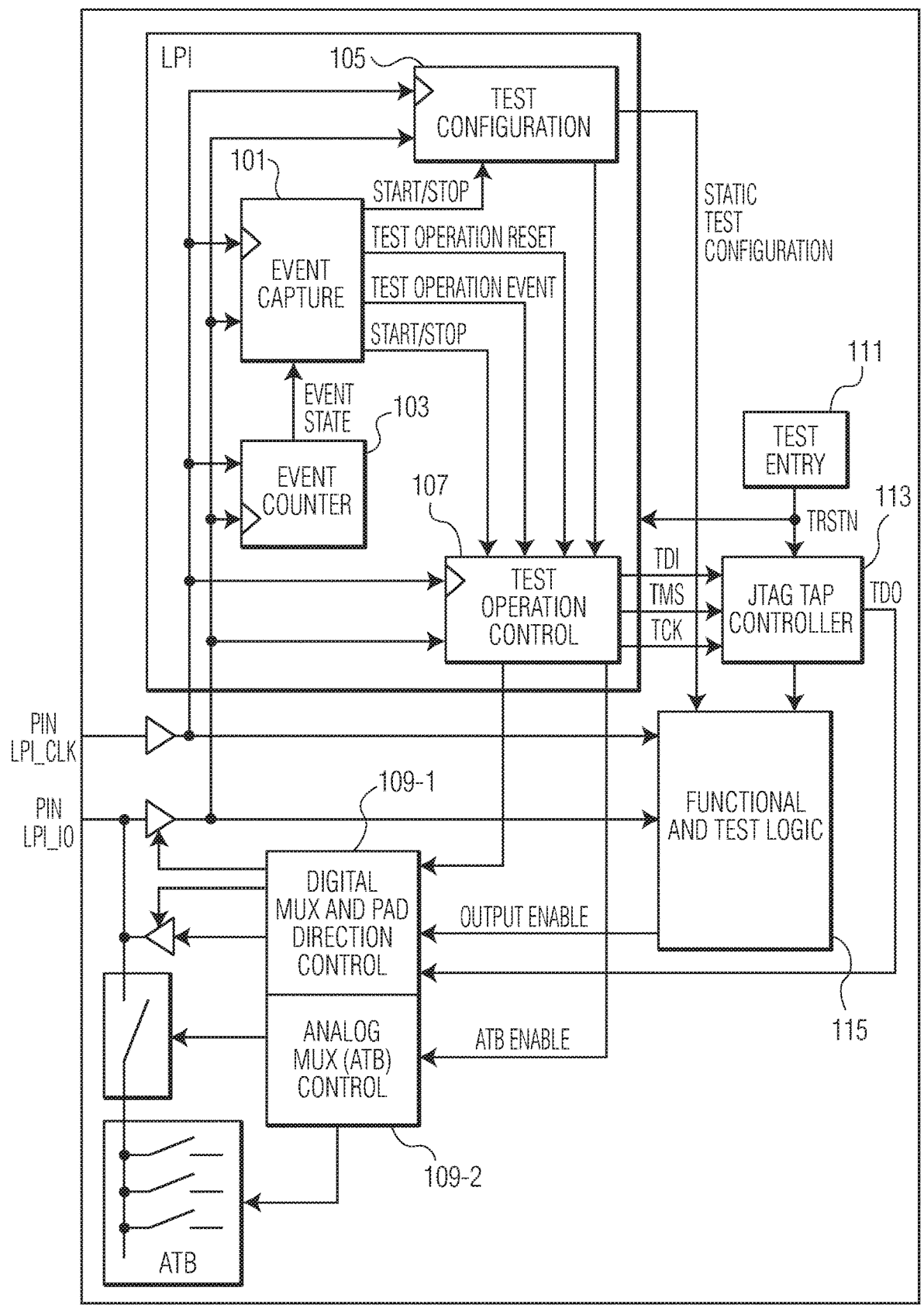
FIG. 1 illustrates an example IC chip-based apparatus for a limited pin test interface with an analog test bus, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving test control and test access on integrated circuits (ICs). While not necessarily so limited, various aspects may be appreciated through the following discussion of non-limiting examples which use exemplary contexts.

In accordance with examples of the present disclosure, computer-executable instructions that implement test control and test access configuration via two pins enables the use of one of the two interface pins as an analog test bus (ATB) for analog current/voltage drive/measurement. The two interface pins can be reused from the application interface and can be used for test and/or debug execution (e.g. time multiplexed access to IEEE1149.1 TAP controller, to IEEE1687 on chip instruments, to scan test, etc.). Aspects of the present disclosure enable the switching of test configurations for different types of tests under control of the tester system. The tester system may interchangeably be referred to herein as a tester and/or a controller. Embodiments of the present disclosure do not require an on-chip or technology specific feature, (like the on-chip delay behavior required by the two-pin access defined in IEEE1149.7 standard). Rather, example embodiments of the present disclosure use logic that is directly driven from primary pins. Moreover, aspects of the present disclosure do not use a specific tester feature, do not have speed limitations, and can run as fast or slow as the application standard logic. Aspects of the present disclosure run fully synchronous with tester, without the need for on-chip synchronization, and allow application logic to be fully tested since this logic is not required for test control and/or test access configuration.

Aspects of the present disclosure enable a protocol in which two tester clock cycles are assigned to a tester strobe which enables a fully synchronous operation driven by the tester clock and removes technology dependent on-chip delay, in contrast to the IEEE1149.7 where defined protocols assign a single cycle for a tester probe.

More specifically, aspects of the present disclosure include the use of configured protocols for further test execution where two pins are assigned to a configuration mechanism that defines on-silicon features in a 'static' state prior to test protocol execution. This enables selection of one test protocol, and conditions, out of a multitude. Moreover, aspects of the present disclosure are directed toward the use of dynamic events in addition to test protocol execution.

In various example embodiments described herein, one of the two pins on an IC can be used as a digital input/output and as an access to an analog test bus. The test interface may be locked, and the two pins may be enabled as an analog test bus, and data input or data output. After the lock event is activated, a test entry reset can be applied to restart normal operation of the interface. Example embodiments therefore include an on-chip two pin test interface that can configure and execute multiple test protocols including IEEE1149.1 TAP, synchronous to a tester system without a hand-shake tester communication and without further involvement of on-chip application logic.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

A silicon die may have at least two pads/pins that can be physically connected to a tester system. In accordance with the present disclosure, test access may be enabled via two pads/pins while an analog drive/measurement is enabled via one pin used as an analog test bus. The test access is technology independent, is speed independent, is fully synchronous to the tester system, and no additional on-chip circuit is required. Upon test mode entry, one pin may be used to operate as clock/reset input and one pin may be used as data in. An event counter on the data pin with a reset on the clock input can be used to identify an escape sequence. Each defined escape sequence may trigger a specific interface state.

In various example embodiments, an event counter state is captured and optionally the data pin value triggered by the clock input. The resulting captured state can be used to assign the two pins to a specific test protocol and provide a defined protocol start, which may be used to operate synchronous to a tester system. The resulting captured state can be used to enable a protocol in which two tester clock cycles are assigned to a tester strobe. This enables a fully synchronous operation driven by the tester clock. Additionally, the resulting captured state can be used to enhance or extend a test protocol with 'dynamic' control of on-chip signals during the test protocol execution (e.g. Internal scan enable, mask internal clocks, enable analog test bus usage). Moreover, aspects of the present disclosure allow for locking the test interface and enabling the usage of the two pins as an analog test bus, data input or data output. After the lock event is activated, a test entry reset can be applied to restart normal operation of the interface.

Aspects of the present disclosure are directed toward an IC chip-based apparatus for use in connection with a controller in testing a target IC. Specifically, example embodiments include an IC chip-based apparatus (or sometimes "IC-based circuit," e.g., referring to an integrated circuit having at least some of its circuitry in a chip with at least one access pin for accessing internal signals) including an event (or event-capture) circuit configured and arranged to control logic states through which a static test configuration is selected for a given event detected in response to a clock signal and to a data signal respectively derived from the controller. Consistent with such embodiments, the controller includes circuitry configured and arranged with the clock pin and the I/O pin and with circuitry configured to perform testing. The IC chip-based apparatus further includes a test-operation control circuit configured and arranged to test the target IC by selectively configuring each of the clock pin and the I/O pin of the controller for use as an analog test bus, data input to the controller or data output from the controller. Moreover, the test-operation control circuit is configured and arranged to test the target IC by carrying out dynamic operations by communicating test signals via pins of the target IC. The dynamic operations, carried out by the test-operation control circuit, are compliant with the selected test configuration, in synchronism with the clock signal of the controller, and in accordance with a test protocol as selected in response to the selected test configuration.

In various example embodiments, the IC chip-based apparatus is configured and arranged as a two-pin test interface device configured and arranged with two pins to provide two respective connections with the clock pin and the I/O pin of the controller. The two pins may be selectively configurable as the analog test bus, data input to the controller or data output from the controller, and configurable to provide a plurality of target-IC connections with pins of the target IC. Particularly, the I/O pin can be selectively configured, during operation of the test-operation control circuit, for use as at least one of digital data input and digital data output. The I/O pin may be selectively configured for use as digital data input during operations in which the event (capture) circuit transitions through event sequences in response to the test-operation control circuit.

Additionally and/or alternatively, the clock pin and the I/O pin of the controller may be selectively configurable as an analog test bus, data input to the controller or data output from the controller, and to provide a plurality of target-IC connections with TDO, TDI and TCK pins of the target IC for communicating scan test signals. The IC chip-based apparatus may be configured and arranged to provide a plurality of target-IC connections of the target IC for communicating test signals operating at a fractional frequency rate (e.g., one quarter) relative to the clock signal of the controller.

In some example embodiments, the event (capture) circuit and the test-operation control circuit are configured and arranged to enter into a locked logic state, corresponding with a mode for testing the target IC. The event (capture) circuit and the test-operation control circuit are further configured and arranged to unlock from the locked logic state in response to a reset signal or power-down mode. In such exemplary embodiments, the event counter circuit can be configured and arranged, in response to the clock signal and to the data signal by counting or tracking through a sequence of signal-indicated events provided by the controller, to provide signals as used by the event (capture) circuit for controlling the logic states.

Consistent with the above example embodiments, the IC chip-based apparatus can include an interface-signal direction control circuit configured and arranged, in response to a control signal provided from the target IC, to control whether the I/O pin of the controller is to be used by circuitry, including the event (capture) circuit, for providing data as data input to the controller or providing data as data output from the controller.

In some example embodiments, the IC chip-based apparatus includes an interface-signal direction control circuit configured and arranged, in response to a control signal provided from the target IC, to control how the I/O pin of the controller is to be used by the circuitry. For example, the interface-signal direction control circuit can be configured and arranged to determine whether the I/O pin of the controller is to be used by circuitry, including the event (capture) circuit, for providing data as data input to the controller or providing data as data output from the controller. Additionally, the IC chip-based apparatus can be configured and arranged as a two-pin test interface device configured and arranged with two pins to provide two respective connections with the clock pin and the I/O pin of the controller. The I/O pin can be selectively configured for use as digital data input during operations in which the event (capture) circuit transitions through event sequences in response to the test-operation control circuit. The event (capture) circuit and the test-operation control circuit can be configured and arranged to enter into a locked logic state, corresponding with a mode for testing the target IC, and further configured and arranged to unlock from the locked logic state in response to a reset signal or power-down mode. As such, the IC chip-based apparatus can be configured and arranged as a two-pin test interface device configured and arranged with two pins to provide two respective connections with the clock pin and the I/O pin of the controller being selectively configurable as the data input to the controller or data output from the controller, and to provide a plurality of target-IC connections with pins of the target IC. Additionally, as discussed further herein, the test-operation control circuit can be configured and arranged to test the target IC by sending a test mode select (TMS) signal to a TAP controller.

Various aspects of the present disclosure are directed toward methods for use in connection with a controller in testing a target IC. For instance, logic states may be controlled in an event circuit by controlling logic states, within the event circuit. The logic states may be controlled to set and enable a static test configuration for a given event detected in response to a clock signal and to a data signal respectively derived from a clock pin and an I/O pin of the controller. A test-operation control circuit may be used in response to the event circuit, for testing the target IC. The test-operation control circuit may selectively configure the clock pin and the I/O pin of the controller for use as one or more of an analog test bus, data input to the controller or data output from the controller. Moreover, the test-operation control circuitry may carry out dynamic operations by communicating test signals via pins of the target IC, as described herein.

FIG. 1 illustrates an example IC chip-based apparatus for a limited pin test interface with an analog test bus, in accordance with the present disclosure. As illustrated, an event capture module 101 may be triggered by clock pin LPI_CLK. The event capture module 101 may capture the event state from an event counter 103. In some example embodiments, the value of pin LPI_IO is used in addition to the event state to compile the captured event. Additionally, in some example embodiments, a test configuration module 105 can be activated/inactivated by the start/stop control from the event capture module 101. Moreover, a test operation control module 107 may be activated and/or inactivated by the start and/or stop control from the event capture module 101. Active test configuration and test operation may be mutually exclusive, as the test configuration module 105 provides the protocol and conditions for the test operation (e.g., the test protocol execution). As described herein, a global test entry reset instruction returns the interface to the initial state. In various embodiments, the initial state may be a test related state or a non-test state.

In various embodiments, the IC chip-based apparatus includes an analog multiplexer (ATB) control module 109-2, and a digital multiplexer and pad direction control module 109-1. Each of modules 109-2 and 109-1 operate with a test entry module 111 configured as an interface to provide data used as test signals, and as are conventional, a JTAG test access port (TAP) controller 113 and functional test logic 115. As with other similarly-depicted circuit blocks, each of these modules/blocks (e.g., 109-2, 111) is implemented as logic circuits using any of a variety of functionally-defined circuitry types, and is configured and arranged to process and respond to signals provided at the chip pins labeled "PIN LPI_CLK" and "PIN LPI_IO".

The LPI_CLK and LPI_IO pins illustrated in FIG. 1 are selectively controlled to perform the various methods described in the present disclosure. For instance, in test operation control where a test protocol is executed, the LPI_CLK pin may be used for clock activation or to reset an event counter, and the LPI_IO pin may be used as an input/output data or analog test bus. In test configuration mode where the IC is switching between test mode and operating mode (e.g., changing protocol), the LPI_CLK pin may be used for clock activation or to reset an event counter, and the LPI_IO pin may be used for input of data. In an event counter mode where particular events are counted, the LPI_CLK pin can be used for clock inactivation or reset of an event counter inactive state, and the LPI_IO pin can be used for input of data or a number of events. Moreover, in an event capture mode, the LPI_CLK pin may be used for clock activation or posedge capture or async capture (negedge reset), and the LPI_IO pin may be used for input data true or false.

During test operation, LPI_CLK can be used as a tester clock input. Events on the LPI_CLK may reset the event counter module 103. During test operation, pin LPI_IO can be used for input/output data or as an analog test bus to drive/measure current/voltage. During configuration, operation of the LPI_IO pin may be limited to input data and may be used to load new configuration data from tester to on-silicon configuration logic. In an event that brings the event counter module 103 to a next state, events are counted on the LPI_IO pin that is configured as input data, and the LPI_CLK pin is driven to an inactive state (e.g., inactive value for reset of the event counter module 103).

During an event capture, two types of events can be classified. First, a synchronous capture event can be triggered by LPI_CLK, and second a synchronous capture event can be triggered by the event state. The latter uses a capture event reset triggered by LPI_CLK to keep the interface and communication synchronous to the tester system connected to LPI_CLK and LPI_IO.

Figure 2:
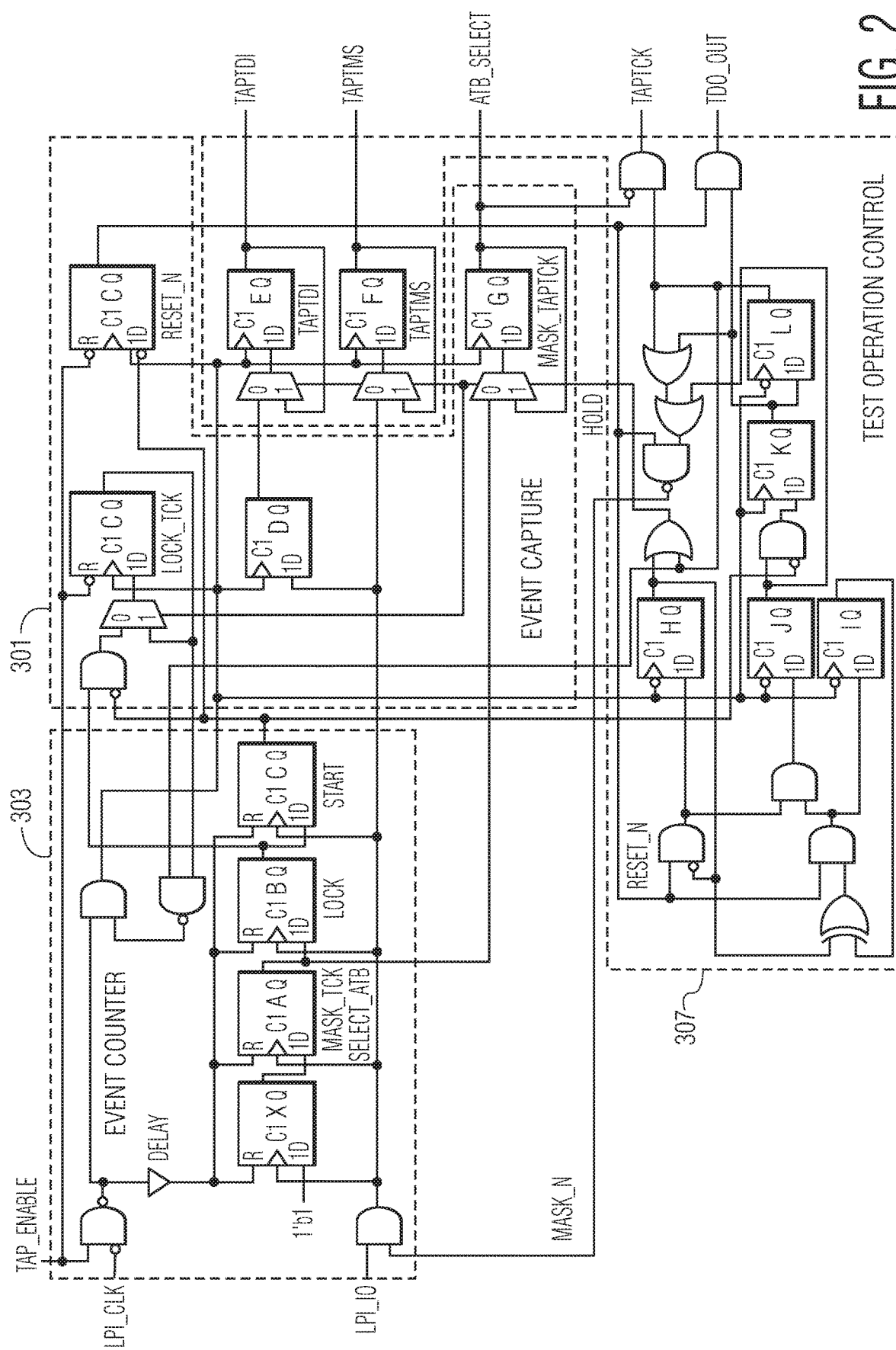
FIG. 2 illustrates an example two pin on-chip TAP/scantest/ATB control system, in accordance with the present disclosure.

FIG. 2 illustrates an example two pin on-chip TAP/scantest/ATB control system, in accordance with the present disclosure. The event counter module 203 may be analogous to the event counter module 103, the event capture module 201 may be analogous to the event capture module 101, and the test operation control module 207 may be analogous to the test operation control module 107, each respectively illustrated in FIG. 1. In FIG. 2, the right-hand side may feed into an IEEE1149.1 compliant TAP controller (TAPTDI, TAPTMS and TAPTCK) or another test controller. In this embodiment, the event counter module 203 may support three events: a MASK_TCK/SELECT ATB event, a LOCK event, and a START event. When applied followed by a capture event on the rising edge LPI_CLK, the MASK_TCK/SELECT ATB event masks a single cycle of the internal TAPTCK clock and is applied synchronously with the on-chip signals TAPTDI, TAPTMS. Testing of on-chip asynchronous logic may be used under control of TAPTDI. If LPI_CLK is not pulsed after the sequence is applied, ATB SELECT will continuously mask the internal TAPTCK and in the meantime the LPI_IO pin is enabled as an Analog Test Bus (ATB) in case this protocol is active and/or configured. The ATB in this implementation may be driven and/or measured from and/or to an on-chip ATB, for which the enabling and/or disabling logic may be controlled by TDO_OUT and ATB SELECT. TDO_OUT and ATB SELECT are referred to in FIG. 1 as LPI_IO output enable and LPI ATB enable consecutively.

If the START event sequence is applied and followed by capture event on the rising edge LPI_CLK with primary pin LPI_IO driven to a logic high value, the low active RESET N is activated to reset the counter on the next falling edge of LPI_CLK. From this moment on, the tester system connected to LPI_CLK and LPI_IO a time multiplexed data stream can be driven that is synchronized with the on-chip test operation control module 307 shown in FIG. 2. The test operation control module 307 includes a two-bit counter that controls sample and hold circuitry via signal HOLD. Accordingly, the internal signals TAPTDI, TAPTMS and TAPTCK operate at one fourth the frequency in comparison with the primary pins LPI_CLK and LPI_IO. In addition to the reset of the counter a reset for the TDO_OUT signal is implemented for proper data pin direction control during reset and start of the test protocol. Given the size of LPI logic in practice it may run much faster than regular on chip logic (e.g., Scan chain for test) which compensates for the time multiplexing cycle overhead. A single pin LPI_IO may be used for digital data input as well as digital data output during test execution. The event sequences can be applied when the data pin LPI_IO is controlled as input. The input data feeds into LPI_IO. The output data in this implementation may be driven from an on-chip TDO from the IEEE1149.1 TAP controller. The control signal TDO_OUT may define the input mode (logic level low) or the output mode (logic level high) of the primary data pin that is not explicitly shown in FIG. 2. The TAP_ENABLE signal may be controlled from application logic, and specifies the initial state of the test interface upon entering test mode from application mode (from logic low to logic high value). When TAP_ENABLE is asserted the test access port is enabled.

If a lock sequence is applied followed by a capture event on the rising edge LPI_CLK, the high active LOCK_TCK is activated to lock the full internal TAP interface (TAPTCK, TAPTDI, TAPTMS) and TDO_OUT will be locked on a logic high value. A loop back test of the two primary pins of the interface (not shown in FIG. 2) may be performed. To restart normal test operation, the test interface may reset to initial state via TAP_ENABLE reset.

Figure 3:
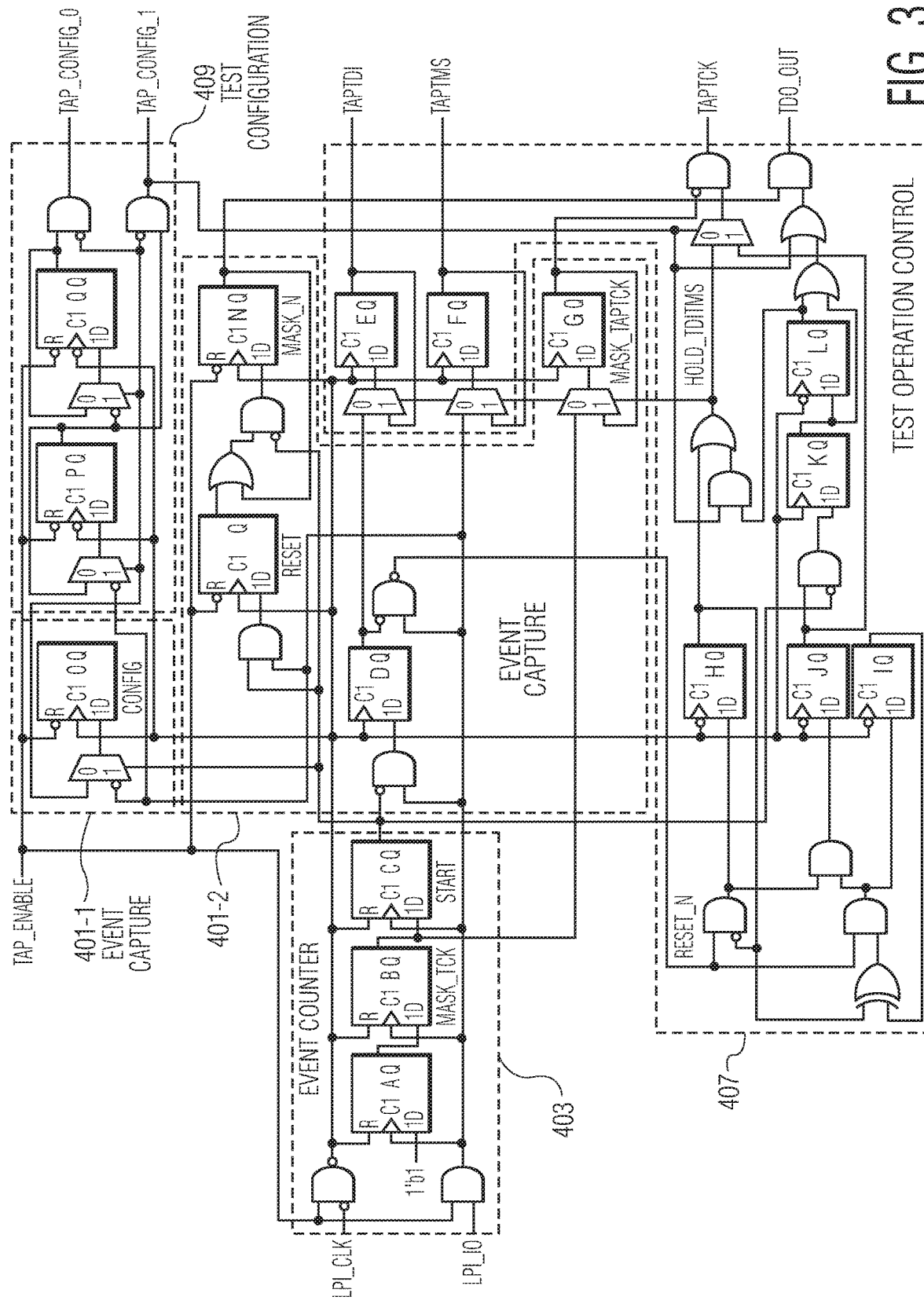
FIG. 3 illustrates an example implementation of a test configuration register in addition to a two pin on-chip TAP/scantest/ATB control system, consistent with the present disclosure.

FIG. 3 illustrates an example implementation of a test configuration register in addition to a two pin on-chip TAP/scantest/ATB control system, consistent with the present disclosure. Test configuration was introduced with regards to FIG. 1. The event counter module 403 may be analogous to the event counter module 103, the event capture modules 401-1 and 401-2 may be analogous to the event capture module 101, and the test operation control module 407 may be analogous to the test operation control module 107, each respectively illustrated in FIG. 1. The TAP_ENABLE signal equals the signal that was introduced in FIG. 2. Consistent with embodiments of the present disclosure, when capturing a START event with a logic high value on LPI_IO, the test configuration register 409 is selected for access. The write operation to the register elements is a synchronous operation with data on LPI_IO input and clock on LPI_CLK. In such example embodiments, data is stored in register elements on the falling edge of the clock. For a timing robust data transfer this follows because the test configuration selection changes on the rising edge of the clock. While configuring, the test operation control 407 is parked. To continue test operation with the newly configured mode of operation, an event sequence with START test operation is applied. In this illustration, LPI_IO is used to select between START CONFIG/START TEST.

Figure 4:
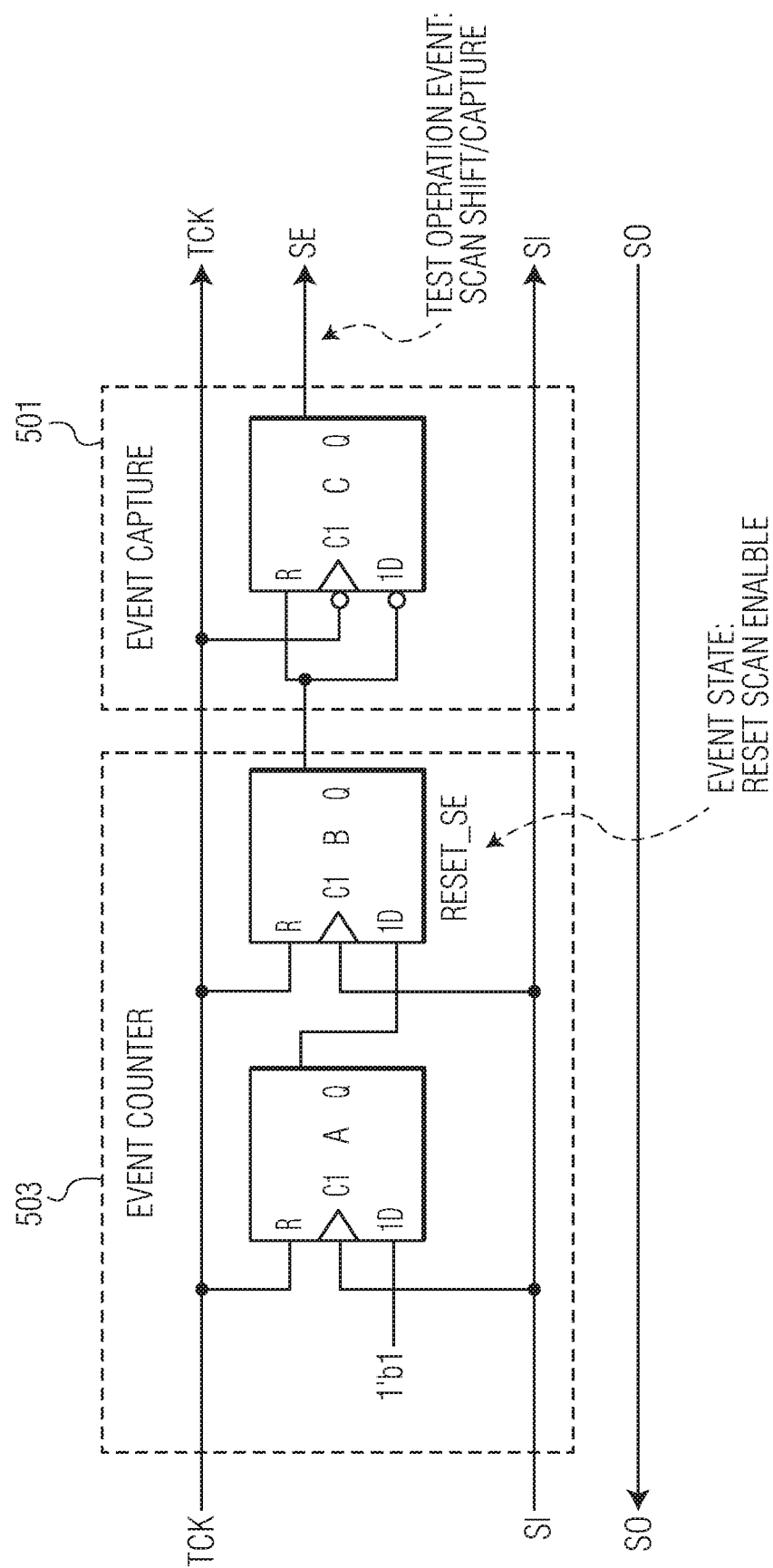
FIG. 4 illustrates an example circuit diagram including on-chip control of a chip internal scan enable (SE) control for structural scantest, in accordance with the present disclosure.

FIG. 4 illustrates an example circuit diagram including on-chip control of a chip internal scan enable (SE) control for structural scantest, in accordance with the present disclosure. In some example embodiments, the SE is directly controlled from a primary pin and drives the shift operation (logic high value) or capture operation (logic low value) of the scan test protocol. Such example embodiments reduce the number of pins connected to the tester system to three (TCK, SI, SO) instead of four. Also, in such example embodiments, the event counter 503 operates on a logic one to logic zero event on data input SI. Events are counted while the scan clock TCK is kept inactive to logic low value. When two pulses are counted, the event capture element 501 asynchronously captures a logic low value triggered by a logic high value on the asynchronous reset input R. A first rising edge on TCK resets the event counter 503 and a next falling edge on TCK resets the internal scan enable to logic level high by a synchronous capture of the event counter module 403 output in reset state.

Figure 5:
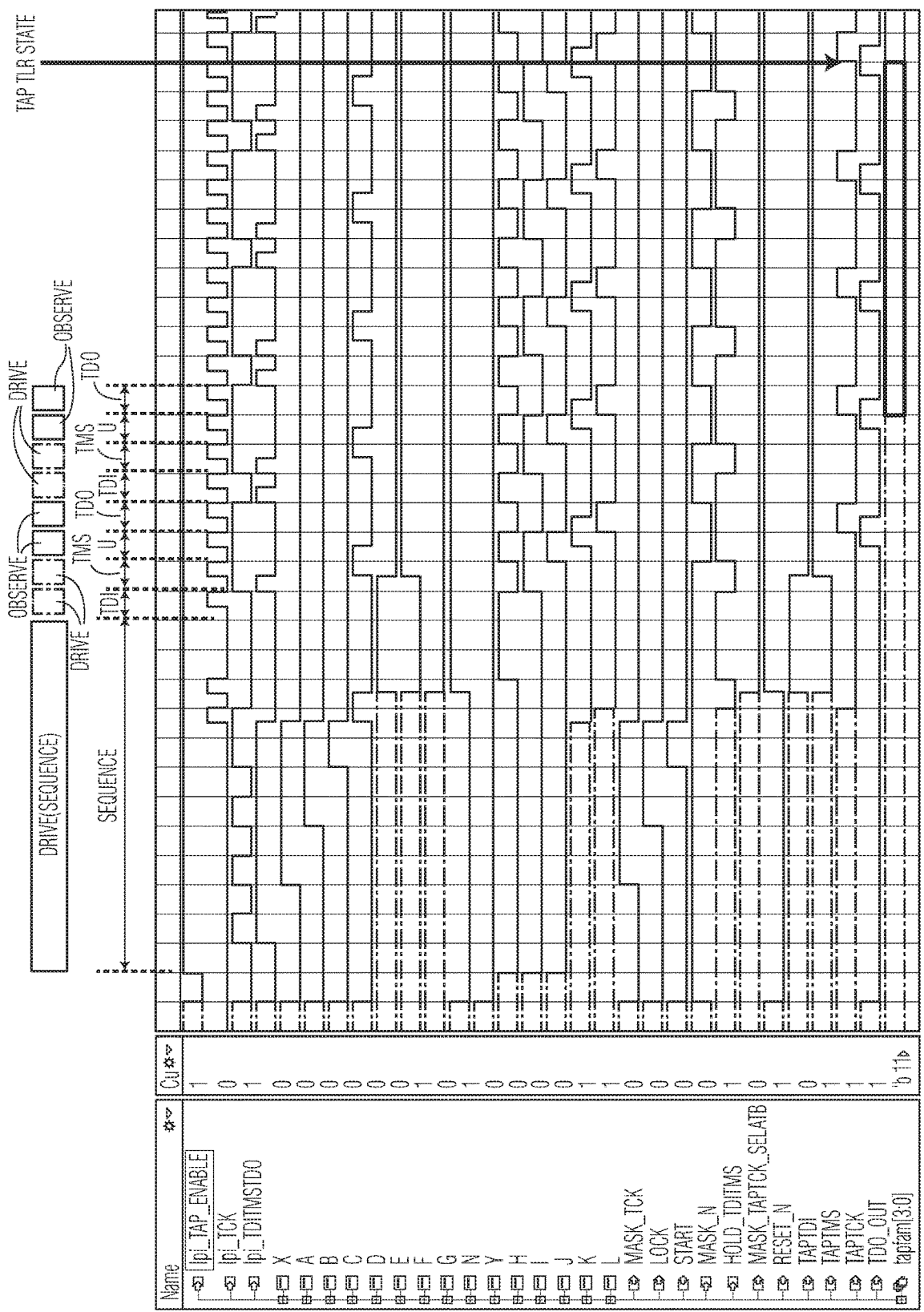
FIG. 5 illustrates an example of a start sequence followed by a tap test logic reset sequence executed by the system illustrated in FIG. 2.

FIG. 5 illustrates an example of a start sequence followed by a tap test logic reset sequence executed by the system illustrated in FIG. 2. The right hand-side of FIG. 5 may feed into an IEEE1149.1 compliant TAP controller. IEEE1149.1 is provided as an example of possible interfaces, though different interfaces may be used, consistent with the present disclosure. Ports referred to in the timing diagrams are: LPI_CLK: limited pin interface clock pin (refer to LPI_TCK in the waveforms); LPI_IO: limited pin interface input/output/ATB pin (refer to LPI_TDTTMSTDO in the waveforms); and TAP_ENABLE: test mode entry pin (refer to LPI TAP_ENABLE in the waveforms).

The pin values described in the sequences tables utilize the following semantics: 1 refers to input drive logic high; 0 refers to input drive logic low; P refers to clock pulse of a clock with zero off state; U refers to output don't observe/measure or observe/measure X; and M refers to output observe/measure. Similarly, the following pin semantics used in the sequences tables include the following: SI refers to scan input (scan protocol); SO refers to scan output (scan protocol); SE refers to scan enable (scan protocol); TDI refers to TAPTDI (JTAG protocol as defined in IEEE1149.1); TDO refers to TAPTDO (JTAG protocol as defined in IEEE1149.1); and TMS refers to TAPTMS (JTAG protocol as defined in IEEE1149.1). For waveform readability and traceability, all sequences (except for the LOCK sequence) are postpended when needed by dummy number of cycles to align all sequences to multiples of four.

The start sequence for the timing diagram of FIG. 5 for the defined sequences for the described system is shown below. Cycles eleven and twelve are dummy cycles added for cycle alignment to multiple of four cycles. The START sequence is followed by a 1149.1 TAP reset sequence driving the TAP to test logic reset state by five TAPTCK cycles with TAPTMS logic 1. The third column "Active element" annotates the active element (element with logic 1 on Q) of the elements shown in FIG. 2.

| Cycle | LPI_CLK | LPI_IO | Active element |
|---|---|---|---|
| 1 | 0 | 0 | — |
| 2 | 0 | 1 | X |
| 3 | 0 | 0 | X |
| 4 | 0 | 1 | X,A |
| 5 | 0 | 0 | X,A |
| 6 | 0 | 1 | X,A,B |
| 7 | 0 | 0 | X,A,B |
| 8 | 0 | 1 | X,A,B,C |
| 9 | P | 1 | D |
| 10 | P | 0 | MASK_N |
| 11 | 0 | 0 | — |
| 12 | 0 | 0 | — |

The test operation sequences of either controlling an on-chip TAP or scan protocol execution are shown below. The sequence is multiple (M) of four cycle protocol where LPI_CLK is pulsed every cycle. In such example embodiment, the first and second cycles LPI_IO are driving input, and third and fourth cycles LPI_IO are observing output.

| Cycle | LPI_CLK | LPI_IO |
|---|---|---|
| 1 | P | TDI/SE |
| 2 | P | TMS/SI |
| 3 | P | U |
| 4 | P | TDO/SO |

| Cycle | LPI_CLK | LPI_IO |
|---|---|---|
| Normal Operation (M*4 cycles) | | |
| D D O O ... D D O O | | |

Figure 6:
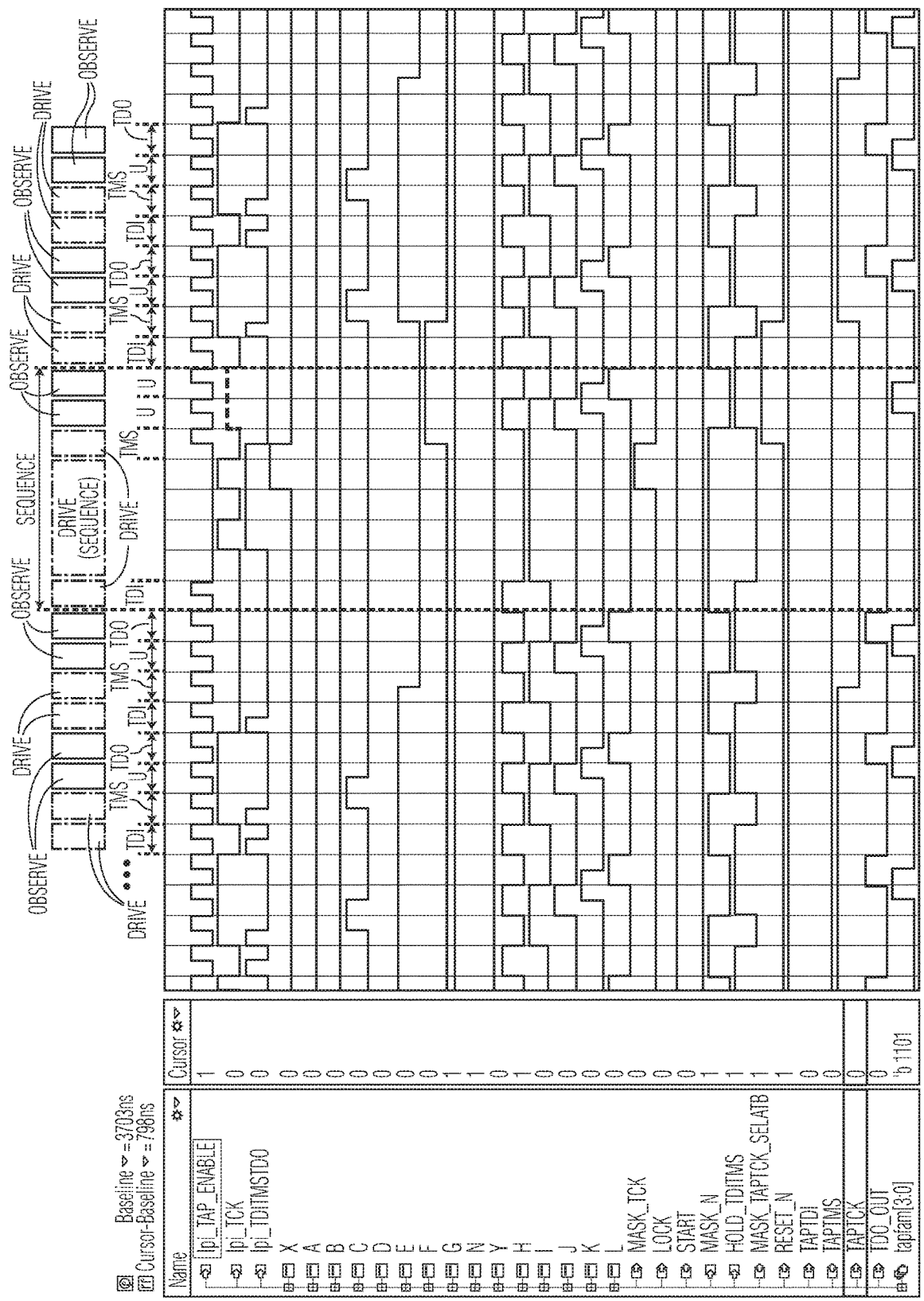
FIG. 6 illustrates a MASK_TCK sequence executed by the system illustrated in FIG. 2.
Figure 7:
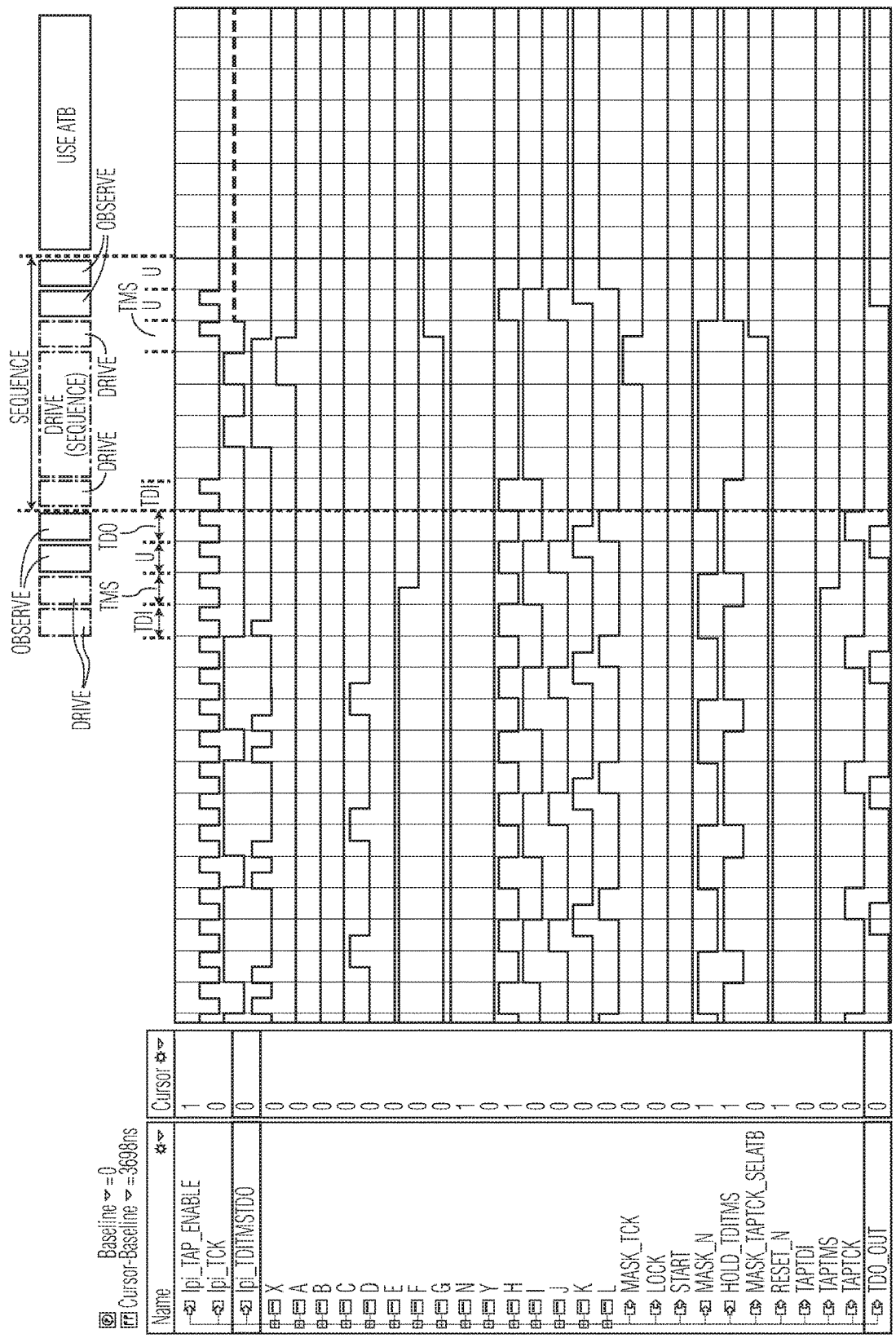
FIG. 7 illustrates a SELECT ATB sequence executed by the system illustrated in FIG. 2.

FIGS. 6 and 7 illustrate a MASK_TCK and SELECT ATB sequences, respectively, executed by the system illustrated in FIG. 2. In this example embodiment, the first seven cycles of the sequences are identical, the eighth cycle which is a dummy cycle used for alignment, is different. In such example embodiments, the MASK_TCK sequence usage is to stop the internal TAPTCK clock for one clock cycle. It is used for scan patterns where the clock is stopped (dead cycles, asynchronous ATPG capture cycles, . . . ). The SELECT ATB sequence is followed by repeated wait cycles where the LPI_CLK is stopped while the ATB measurements take place.

| Cycle | LPI_CLK | LPI_IO |
|---|---|---|
| 1 | P | TDI/SE |
| 2 | 0 | 0 |
| 3 | 0 | 1 |
| 4 | 0 | 0 |
| 5 | 0 | 1 |
| 6 | P | TMS/SI |
| 7 | P | U |
| 8 | P | U |

| | | | Stop one internal TCK cycle | | | | |
|---|---|---|---|---|---|---|---|
| D | S | S | S | S | D | O | O |

| Cycle | LPI_CLK | LPI_IO |
|---|---|---|
| 1 | P | TDI/SE |
| 2 | 0 | 0 |
| 3 | 0 | 1 |
| 4 | 0 | 0 |
| 5 | 0 | 1 |
| 6 | P | TMS/SI |
| 7 | P | U |
| 8 | 0 | U |

Figure 8:
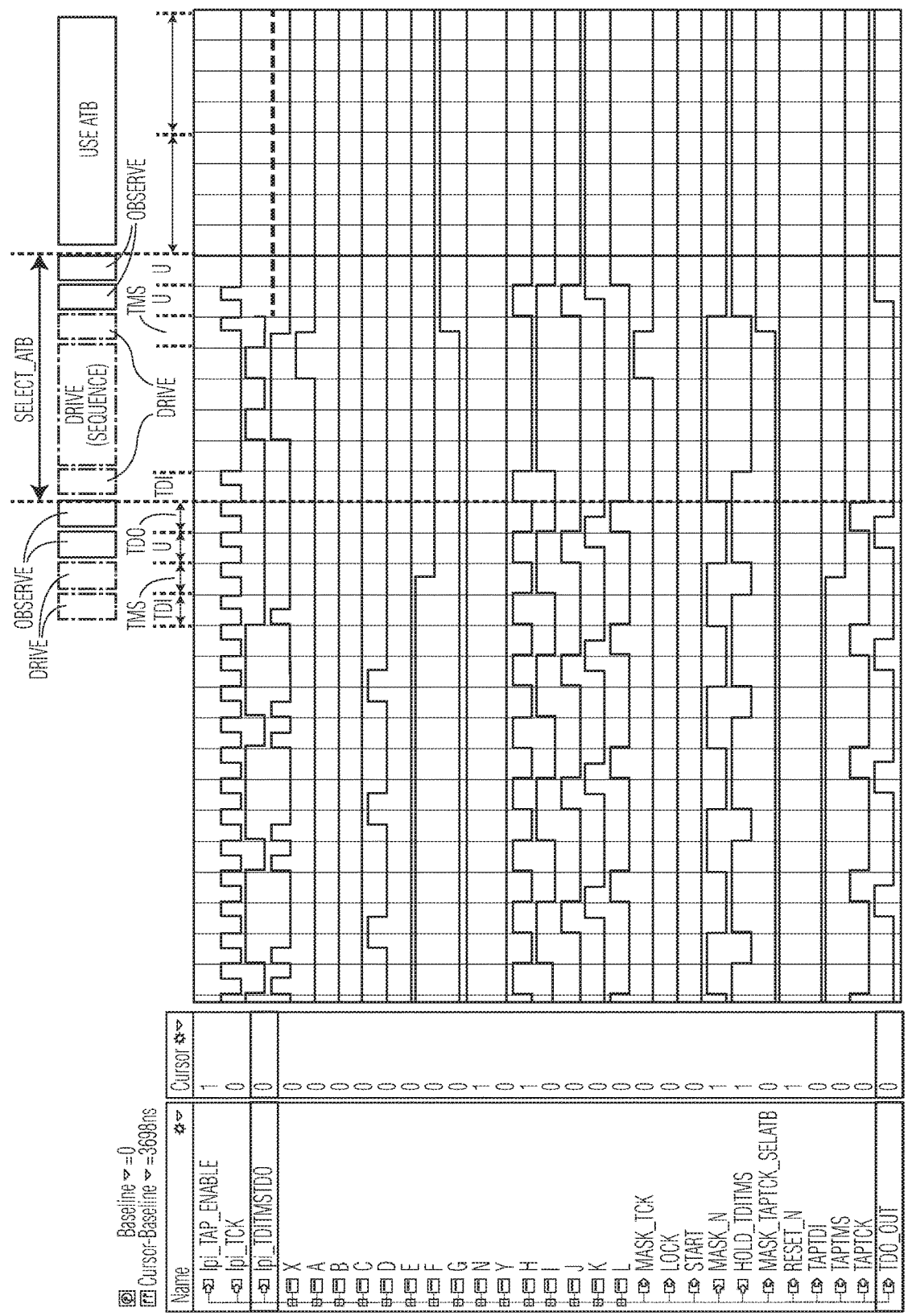
FIG. 8 illustrates an example USE ATB sequence executed by the system illustrated in FIG. 2.

FIG. 8 illustrates an example USE ATB sequence executed by the system illustrated in FIG. 2. Particularly, FIG. 8 illustrates an example sequence that is postpended after the SELECT ATB sequence to preserve the interface state while measure/drive of the LPI_IO pin. The sequence can be repeated as much as needed for the measure/drive. LPI_CLK is forced to "0" and LPI_IO is "U. To keep the alignment (sequences are multiple of 4 cycles) the sequence is 4 cycles and may be repeated:

| Cycle | LPI_CLK | LPI_IO |
|---|---|---|
| 1 | 0 | U |
| 2 | 0 | U |
| 3 | 0 | U |
| 4 | 0 | U |

Figure 9:
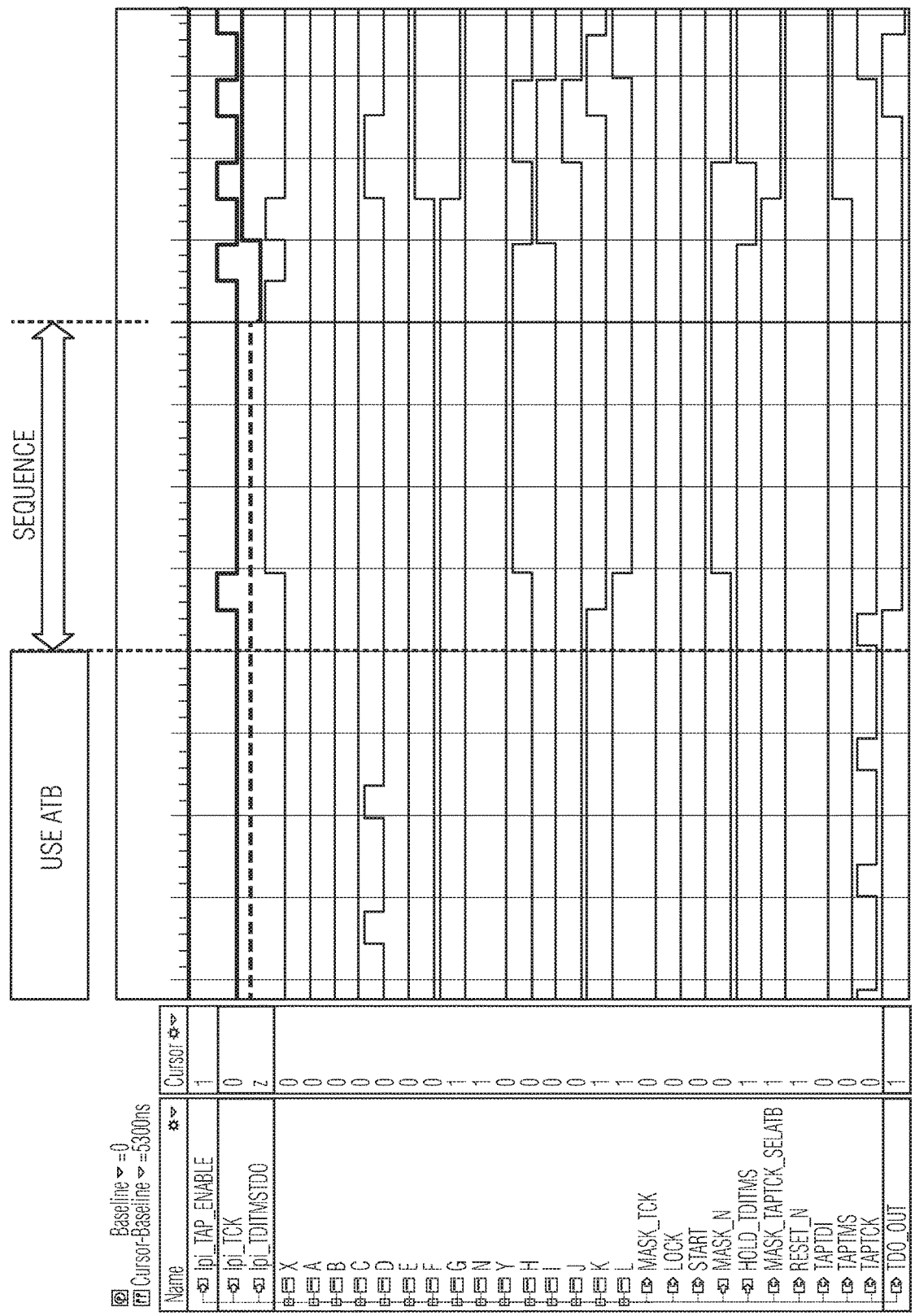
FIG. 9 illustrates an example RELEASE ATB sequence executed by the system illustrated in FIG. 2.

FIG. 9 illustrates an example RELEASE ATB sequence executed by the system illustrated in FIG. 2. Particularly, FIG. 9 illustrates a sequence that is used to release the ATB. To release the ATB, one cycle is used where LPI_CLK is pulsed. For cycle alignment, an additional three cycles are added, where LPI_CLK is forced to "0":

| Cycle | LPI_CLK | LPI_IO |
|---|---|---|
| 1 | P | U |
| 2 | 0 | U |
| 3 | 0 | U |
| 4 | 0 | U |

Figure 10:
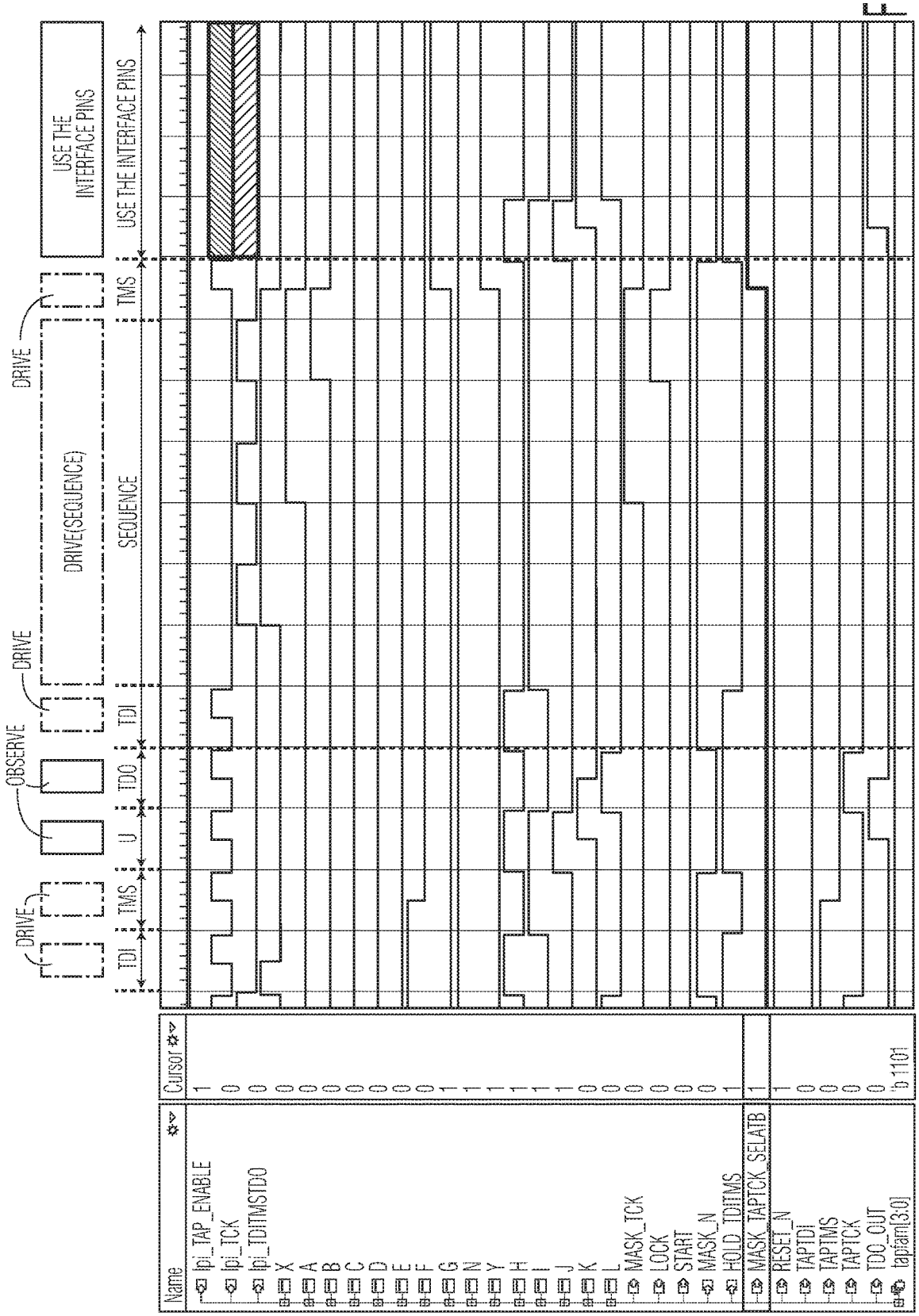
FIG. 10 illustrates an example LOCK sequence executed by the system illustrated in FIG. 2.

FIG. 10 illustrates an example LOCK sequence executed by the system illustrated in FIG. 2. The sequence illustrated in FIG. 10 corresponds with the following:

| Cycle | LPI_CLK | LPI_IO |
|---|---|---|
| 1 | P | TDI/SE |
| 2 | 0 | 0 |
| 3 | 0 | 1 |
| 4 | 0 | 0 |
| 5 | 0 | 1 |
| 6 | 0 | 0 |
| 7 | 0 | 1 |
| 8 | P | TMS/SI |
| 9 | P | U |

Figure 11A:
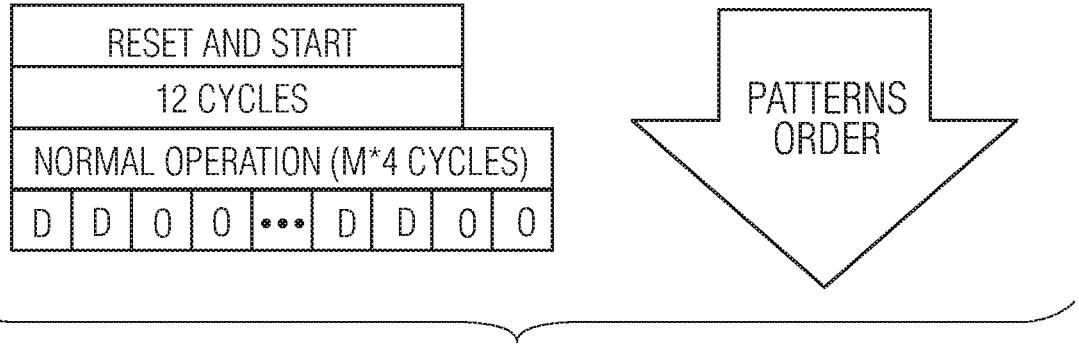
FIGS. 11A-11D illustrate example combinations of sequences used to compose different test patterns, in accordance with the present disclosure.
Figure 11B:
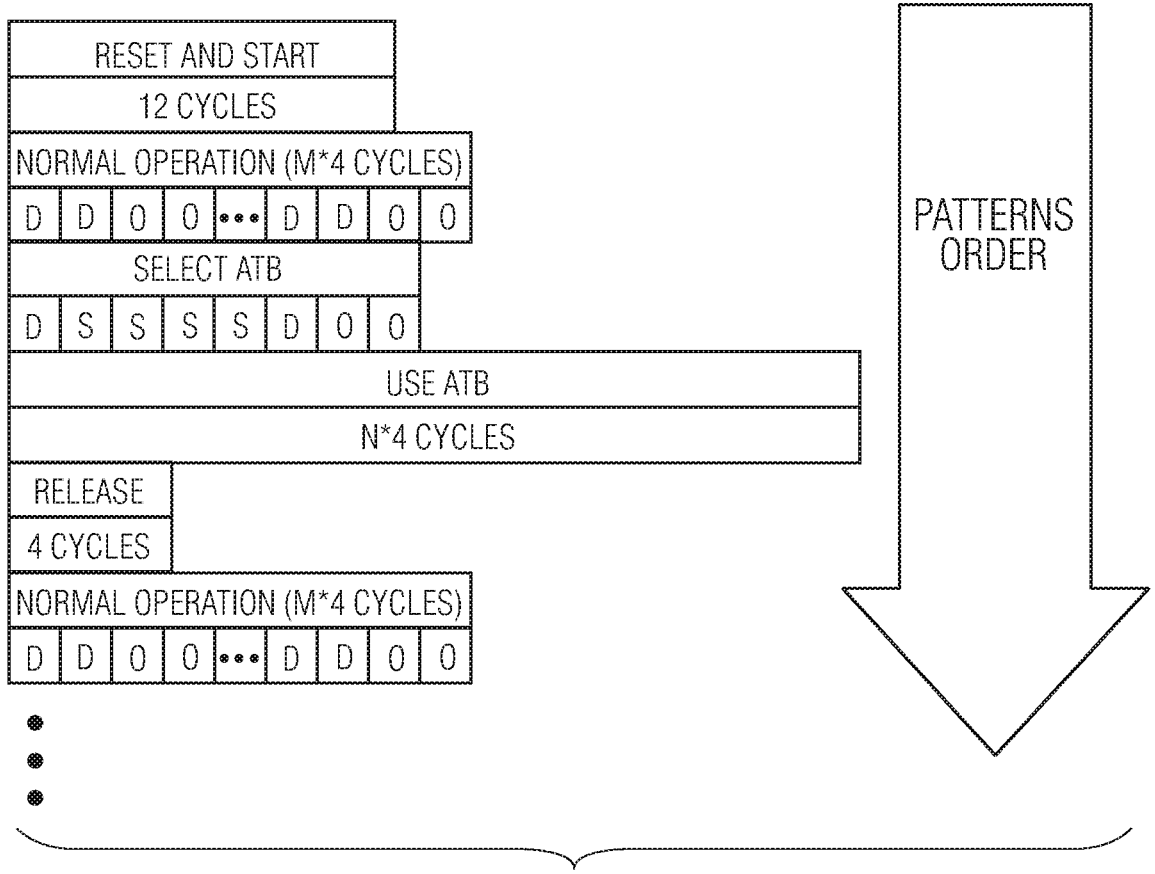
Figure 11C:
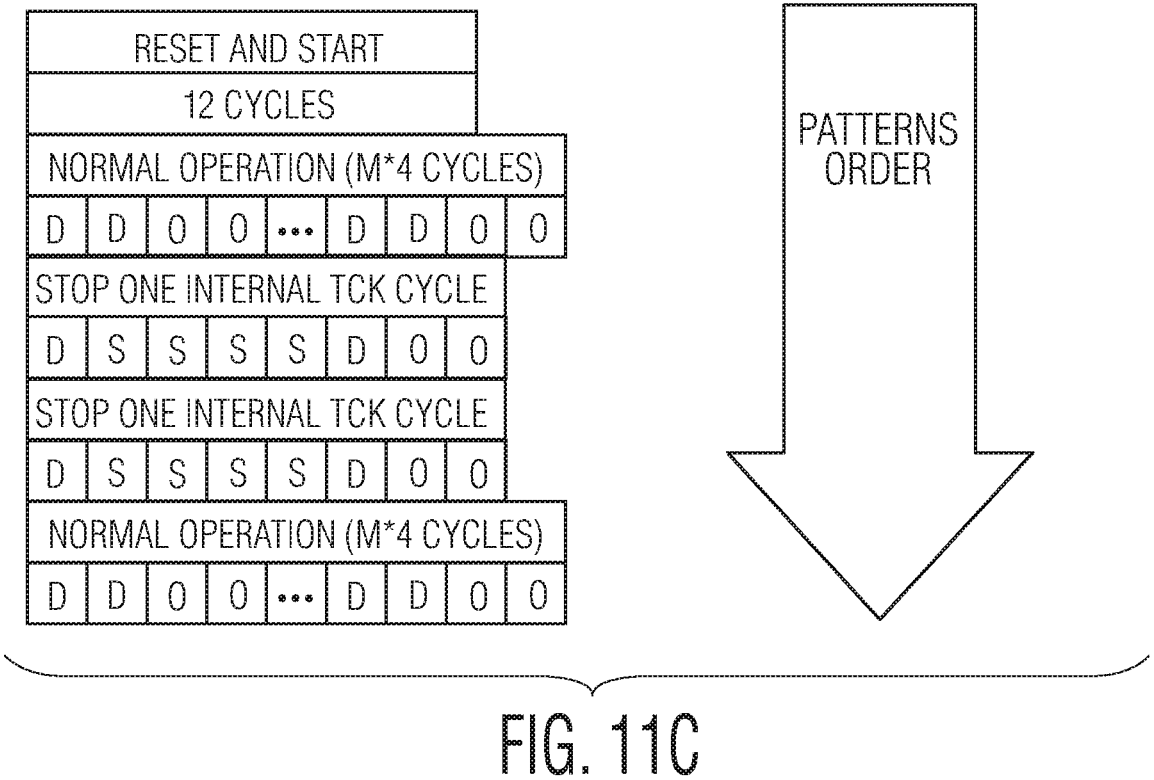
Figure 11D:
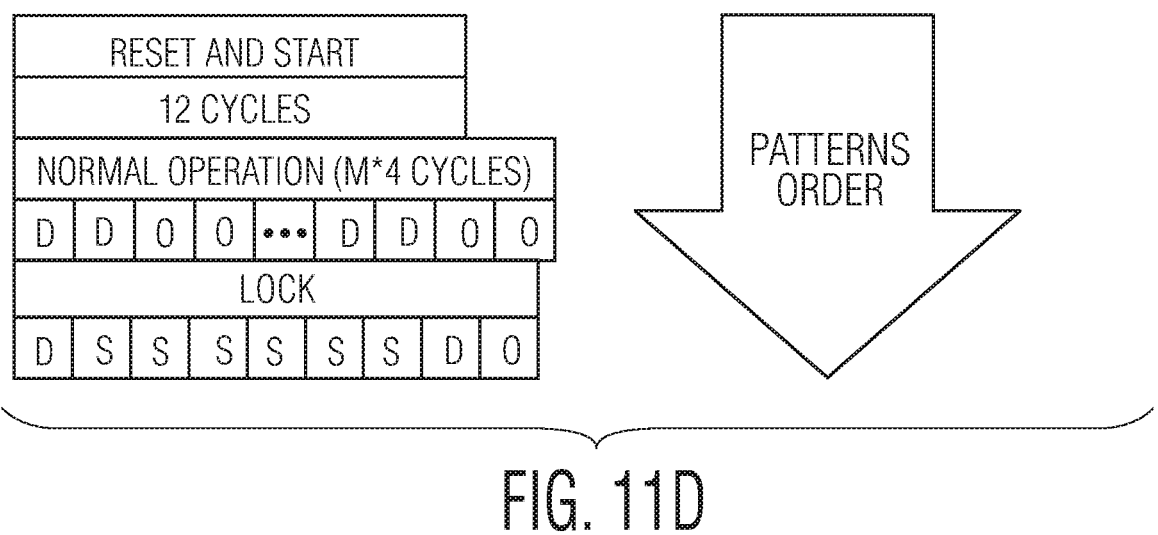

FIGS. 11A-11D illustrate example combinations of sequences used to compose different test patterns, in accordance with the present disclosure. Particularly, FIG. 11A illustrates an example sequence for control of an on-chip TAP pattern with no ATB usage. FIG. 11B illustrates an example sequence for control of an on-chip TAP pattern with ATB measurement or drive. FIG. 11C illustrates an example sequence for executing a scan pattern with internal TCK stop, and FIG. 11D illustrates an example sequence for executing a loop back test pattern.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, controller, module and/or other circuit-type depictions (e.g., reference numerals 101, 103, 105, 107, and 109 of FIGS. 1, 301, 303, and 307 of FIGS. 2, 401-1, 401-2, 403, and 407 of FIGS. 3, 501 and 503 of FIG. 4 depict a module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1, 2, 3, and 4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described with regards to FIGS. 1, 2, 3, and 4 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, more or fewer components may be included than that which is illustrated in FIG. 1. As another example, more or fewer components may be included in that which is illustrated in FIGS. 2, 3, and 4. Such modifications do not depart from the true spirit and scope of various aspects of the disclosure, including aspects set forth in the claims.

What is claimed is:

1. For use in connection with a controller in testing a target integrated circuit (IC), an IC chip-based apparatus comprising:
    an event capture circuit configured and arranged to control logic states through which a static test configuration is selected for a given event detected in response to a clock signal and to a data signal respectively derived from the controller;
    a test-operation control circuit configured and arranged to test the target IC by:
        selectively configuring each of clock pin and a I/O pin of the controller for use as an analog test bus, data input to the controller or data output from the controller; and
        carrying out dynamic operations by communicating test signals via pins of the target IC which are:
            compliant with selected test configuration;
            in synchronism with the clock signal of the controller; and
            in accordance with a test protocol as selected in response to the selected test configuration.

2. The apparatus of claim 1, wherein the IC chip-based apparatus is configured and arranged as a two-pin test interface device configured and arranged with two pins to provide two respective connections with the clock pin and the I/O pin of the controller that are selectively configurable as the analog test bus, data input to the controller or data output from the controller, and to provide a plurality of target-IC connections with pins of the target IC.

3. The apparatus of claim 1, wherein the IC chip-based apparatus is configured and arranged as a two-pin test interface device configured and arranged with two pins to provide two respective connections with the clock pin and the I/O pin of the controller that are selectively configurable as the analog test bus, data input to the controller or data output from the controller, and to provide a plurality of target-IC connections with TDO, TDI and TCK pins of the target IC for communicating scan test signals.

4. The apparatus of claim 1, wherein the IC chip-based apparatus is configured and arranged as a two-pin test interface device configured and arranged with two pins to provide two respective connections with the clock pin and the I/O pin of the controller that are selectively configurable as the analog test bus, data input to the controller or data output from the controller, and to provide a plurality of target-IC connections of the target IC for communicating test signals operating at a fractional frequency rate relative to the clock signal of the controller.

5. The apparatus of claim 1, wherein the IC chip-based apparatus is configured and arranged as a two-pin test interface device configured and arranged with two pins to provide two respective connections with the clock pin and the I/O pin of the controller, wherein the I/O pin is selectively configured, during operation of the test-operation control circuit, for use as at least one of digital data input and digital data output.

6. The apparatus of claim 1, wherein the IC chip-based apparatus is configured and arranged as a two-pin test interface device configured and arranged with two pins to provide two respective connections with the clock pin and the I/O pin of the controller, wherein the I/O pin is selectively configured for use as digital data input during operations in which the event capture circuit transitions through event sequences in response to the test-operation control circuit.

7. The apparatus of claim 1, wherein the event capture circuit and the test-operation control circuit are configured and arranged to enter into a locked logic state, corresponding with a mode for testing the target IC, and further configured and arranged to unlock from the locked logic state in response to a reset signal or power-down mode.

8. The apparatus of claim 1, further including an event counter circuit configured and arranged, in response to the clock signal and to the data signal by counting or tracking through a sequence of signal-indicated events provided by the controller, to provide signals as used by the event capture circuit for controlling the logic states.

9. The apparatus of claim 1, further including an interface-signal direction control circuit configured and arranged, in response to a control signal provided from the target IC, to control whether the I/O pin of the controller is to be used by circuitry, including the event capture circuit, for providing data as data input to the controller or providing data as data output from the controller.

10. The apparatus of claim 1, further including the controller including circuitry configured and arranged with the clock pin and the I/O pin and with circuitry configured to perform testing.

11. The IC chip-based apparatus of claim 1, further including an interface-signal direction control circuit configured and arranged, in response to a control signal provided from the target IC, to control whether the I/O pin of the controller is to be used by circuitry, including the event capture circuit, for providing data as data input to the controller or providing data as data output from the controller and wherein the IC chip-based apparatus is configured and arranged as a two-pin test interface device configured and arranged with two pins to provide two respective connections with the clock pin and the I/O pin of the controller, wherein the I/O pin is selectively configured for use as digital data input during operations in which the event capture circuit transitions through event sequences in response to the test-operation control circuit, wherein the event capture circuit and the test-operation control circuit are configured and arranged to enter into a locked logic state, corresponding with a mode for testing the target IC, and further configured and arranged to unlock from the locked logic state in response to a reset signal or power-down mode.

12. The apparatus of claim 1, wherein the IC chip-based apparatus is configured and arranged as a two-pin test interface device configured and arranged with two pins to provide two respective connections with the clock pin and the I/O pin of the controller that are selectively configurable as the data input to the controller or data output from the controller, and to provide a plurality of target-IC connections with pins of the target IC.

13. The apparatus of claim 1, wherein the test-operation control circuit is configured and arranged to test the target IC by sending a test mode select (TMS) signal to a test access port (TAP) controller.

14. For use in connection with a controller in testing a target integrated circuit (IC), a method comprising:
controlling logic states in an event capture circuit by controlling logic states, within the event capture circuit, to set and enable a static test configuration for a given event detected in response to a clock signal and to a data signal respectively derived from a clock pin and an I/O pin of the controller;
using a test-operation control circuit in response to the event capture circuit, testing the target IC by:
selectively configuring the clock pin and the I/O pin of the controller for use as an analog test bus, data input to the controller or data output from the controller; and
carrying out dynamic operations by communicating test signals via pins of the target IC which are:
compliant with the enabled test configuration;
in synchronism with the clock signal of the controller; and
in accordance with a test protocol as selected in response to the selected test configuration.

15. The method of claim 14, wherein the event capture circuit and the test-operation control circuit are configured as a two-pin test interface circuit configured and arranged with two pins to provide two respective connections with the clock pin and the I/O pin of the controller that are selectively configurable as the analog test bus, data input to the controller or data output from the controller, and to provide a plurality of target-IC connections with pins of the target IC.

16. The method of claim 14, wherein the event capture circuit and the test-operation control circuit are configured as a two-pin test interface circuit configured and arranged with two pins to provide two respective connections with the clock pin and the I/O pin of the controller, wherein the clock pin and the I/O pin of the controller that are selectively configurable for use as an analog test bus, data input to the controller or data output from the controller, and to provide a plurality of target-IC connections with TDO, TDI and TCK pins of the target IC for communicating scan test signals.

17. The method of claim 14, wherein the I/O pin is selectively configured, during operation of the test-operation control circuit, for use as either a digital data input or a digital data output.

18. The method of claim 14, wherein the event capture circuit is integrated with an event counter circuit which operates in response to the clock signal and to the data signal by counting or tracking through a sequence of signal-indicated events provided by the controller, to provide signals as used by the event capture circuit for controlling the logic states.

19. The method of claim 14, wherein the event capture circuit and the test-operation control circuit respond to certain signals from the controller by entering into a locked logic state, corresponding with a mode for testing the target IC, and wherein the locked logic state is unlocked in response to a reset signal or power-down mode.

\* \* \* \* \*